United States Patent [19]
Yoo

[11] Patent Number: 5,751,642
[45] Date of Patent: May 12, 1998

[54] VOLTAGE CONTROL CIRCUIT FOR INPUT AND OUTPUT LINES OF SEMICONDUCTOR MEMORY DEVICE

[75] Inventor: Jei-hwan Yoo, Suwon, Rep. of Korea

[73] Assignee: Samsung Electronics Co., Ltd., Suwon, Rep. of Korea

[21] Appl. No.: 702,356

[22] Filed: Aug. 23, 1996

[30] Foreign Application Priority Data

Aug. 23, 1995 [KR] Rep. of Korea ............... 1995-26186

[51] Int. Cl.$^6$ .................................................. G11C 11/40
[52] U.S. Cl. ............................. 365/189.06; 365/189.11; 365/203
[58] Field of Search ........................ 365/54, 189.06, 365/189.11, 203; 327/51, 52, 58, 334, 398, 437

[56] References Cited

U.S. PATENT DOCUMENTS 5,206,552  4/1993  Iwashita ......................... 327/54

Primary Examiner—David C. Nelms
Assistant Examiner—Hoai V. Ho
Attorney, Agent, or Firm—Marger, Johnson, McCollom & Stolowitz, PC

[57] ABSTRACT

A voltage control circuit is used to control the voltage levels on input and output lines of a semiconductor memory device. A load transistor is controlled by feeding back an output voltage of the input and output lines in order to increase data access speed. The input and output lines are separately controlled by clamp devices that clamp low voltage levels on the input and output lines to voltages between a ground potential and a power supply voltage. The clamping devices are enabled during read operations by feeding back the output data from a sense amplifier coupled to the input and output lines. The sense amplifier senses and amplifies the voltage difference of the input and output lines. The feedback control signal from the sense amplifier eliminates DC current paths while the voltage of the input and output lines are toggled between high and low states. The voltage control circuit increases operation speed and reduces current consumption in the memory device.

11 Claims, 4 Drawing Sheets

000
VOLTAGE CONTROL CIRCUIT FOR INPUT AND OUTPUT LINES OF SEMICONDUCTOR MEMORY DEVICE

BACKGROUND OF THE INVENTION

The present invention relates to semiconductor memory devices, and more particularly, to a voltage control circuit that controls the voltage level of input and output lines of a semiconductor memory device. The voltage control circuit includes load transistors that are controlled by feeding back an output voltage on the input and output lines. The voltatge control circuit allows the memory device to access data at higher speeds and operate with less power.

In a semiconductor memory device, the demand for high speed operation has increased. Thus, an effort has been made to reduce access cycle time of memory devices. Recent research has been focused on synchronous memory devices where a high frequency synchronous signal is input to the memory device via a pin to operate the memory device. In a conventional synchronous memory device or non-synchronous memory device, input and output lines are connected to a bit line via a column select gate. The input and output lines have a great voltage swing between the power supply voltage Vcc and ground voltage Vss.

The input and output lines are precharged by an address transition detector (ATD) every time the column select line is changed by the change of address. As a result, data loaded on the bit line of a column to be selected can be output without being affected by the voltage of the previous input and output lines. Line precharging should allow high speed access operations while reducing current consumption during address transitions.

In the synchronous memory devices, the following conditions should be performed in order to reduce read cycle times to less than 10 nsec. First, it is necessary to eliminate the time (about 3–4 nsec.) required for precharging the input and output lines during data access. Second, a charge sharing operation should be performed for a short time to reduce the amount of voltage swing on the input and output lines while accessing data.

To achieve the above necessities, a precharging method is used on the input and output lines. According to the input and output line precharging method, the voltage on the input and output lines charged during a first data access, is discharged to a bit line sense amplifier during the next data access.

According to conventional methods, a pair of load transistors are connected to the pair of input and output lines and are both activated during a data access. A direct current (DC) continuously flows through the load transistors increasing current consumption. The voltage on the input and output lines is toggled by the bit line sense amplifier. However, the activated load transistors prevent the voltage on the input and output lines from switching between high level and low levels, in turn, slowing the toggle speed of the input and output lines.

SUMMARY OF THE INVENTION

It is an object of the present invention to provide a voltage control circuit that reduces current consumption and accelerates the toggle speed of the input and output lines of a semiconductor memory device.

A voltage control circuit is provided for input and output lines of a semiconductor memory device. The memory device has a pair of bit lines coupled to a plurality of memory cells. A bit line sense amplifier which is connected between the bit lines for sensing and amplifying the voltage difference betwen the bit lines during read operations. A pair of input and output lines are connected to the bit lines via a column select gate. An input and output line sense amplifier which is connected to the input and output lines for sensing and amplifying the voltage difference of the input and output lines. A pair of data lines are connected to the input and output line sense amplifier.

The input and output lines are separately controlled by a clamp circuit that clamps the voltage on the input and output lines while in a low state to a predetermined voltage level value between a ground potential and a power supply voltage. The clamp circuit is activated during read operations by feeding back the output from the input and output line sense amplifier.

In one embodiment, the clamp circuit comprises a pair of load transistors each connected to the input and output lines. The pair of load transistors maintain complementary states with each other according to the output fed back from the input and output line sense amplifier.

The voltage control circuit coupled to the input and output lines, eliminates direct current paths during voltage transition on the input and output lines, thereby lowering current consumption and increasing operation speed.

DETAILED DESCRIPTION OF THE INVENTION

First, the conventional voltage control method for input and output lines will be described with reference to FIGS. 1 and 2. All references to complementary signals are referenced with a tilde "~".

Figure 1:
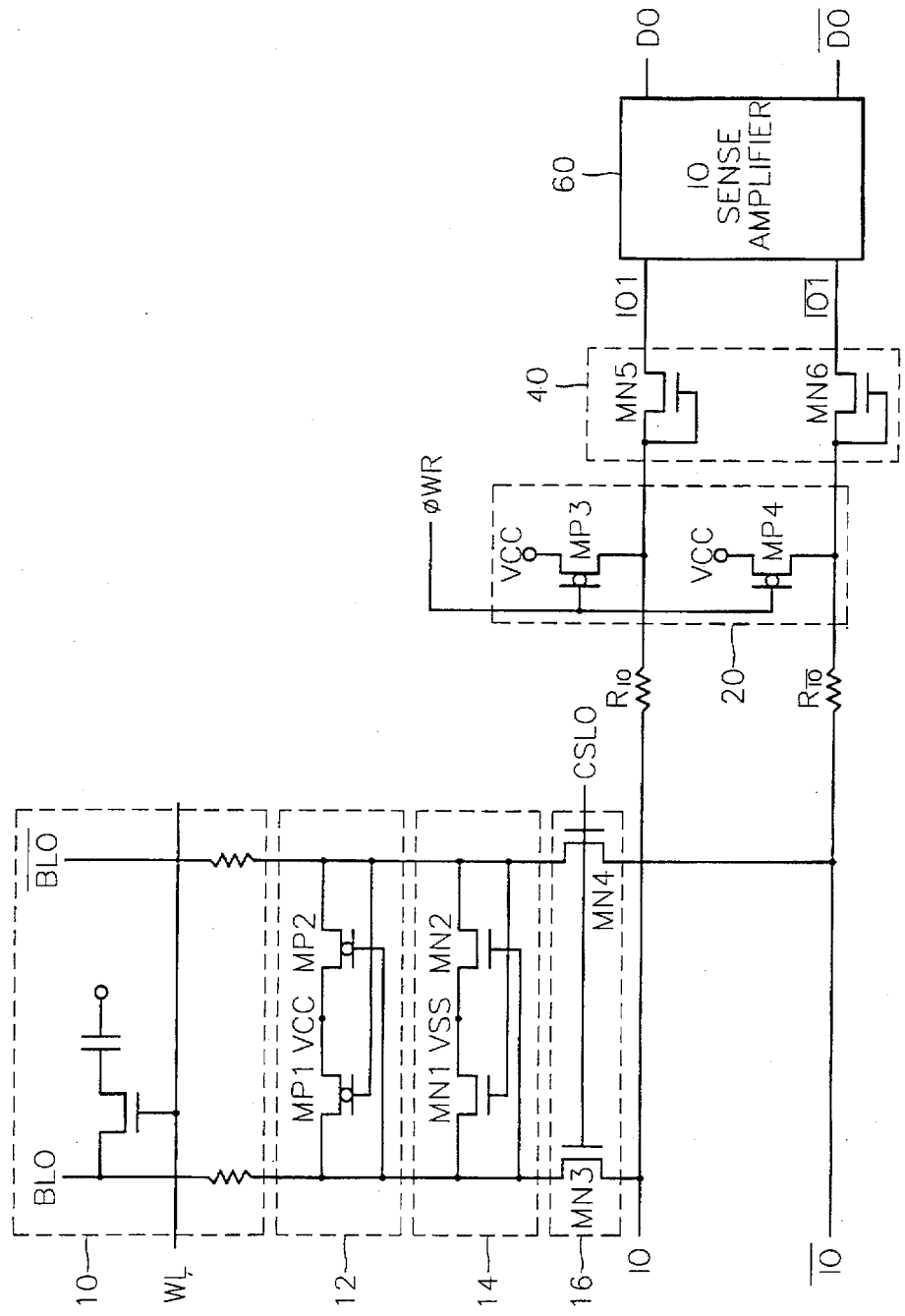
FIG. 1 is a diagram illustrating a conventional voltage control circuit coupled to input and output lines.

Referring to FIG. 1, a memory cell 10 stores data and is connected to a bit line BL0 and accessed in response to the activation of a word line WL. A P-type sense amplifier 12 has PMOS transistors MP1 and MP2 and an N-type sense amplifier 14 has NMOS transistors MN1 and MN2. Amplifiers 12 and 14 are connected between bit lines BL0 and BL1. When accessing data in the memory cell 10, the voltage level at the common node connecting the PMOS transistors MP1 and MP2 in the P-type sense amplifier 12 is equal to the power supply voltage VCC. The voltage level of the common node connecting the NMOS transistors MN1 and MN2 in the N-type sense amplifier 14 is equal to ground potential VSS. Column select transistors MN3 and MN4 are connected between the pair of bit lines BL0 and BL0~ and input and output lines IO and IO~, respectively. The above-described structure is common in memory devices.

Conventional voltage control circuits for input and output lines include a clamp device 20 comprising PMOS transistors MP3 and MP4. The PMOS transistors are coupled to input and output lines IO and IO~, as a load. When reading data, the load transistors MP3 and MP4 are activated generating a direct current flow through MP4, MN4, MN2 and VSS in sequence. If there is no load, the voltage of the input and output line IO~ is continuously decreased until it reaches 0V. However, if direct current flows through the load transistors MP3 and MP4, the voltage of input and output line IO~ is obtained by the following formula (1) according to a voltage division principle.

$$V_{IO-} = \frac{R_{MN2} + R_{MN4} + R_{IO-}}{R_{MN2} + R_{MN4} + R_{IO-}R_{MP4}} \times VCC$$

Thus, the amplitude of the voltage swing for the input and output line IO~ can be fixed to a predetermined value by controlling a resistance value of the PMOS transistor MP4, that is, $R_{MP4}$.

Figure 2:
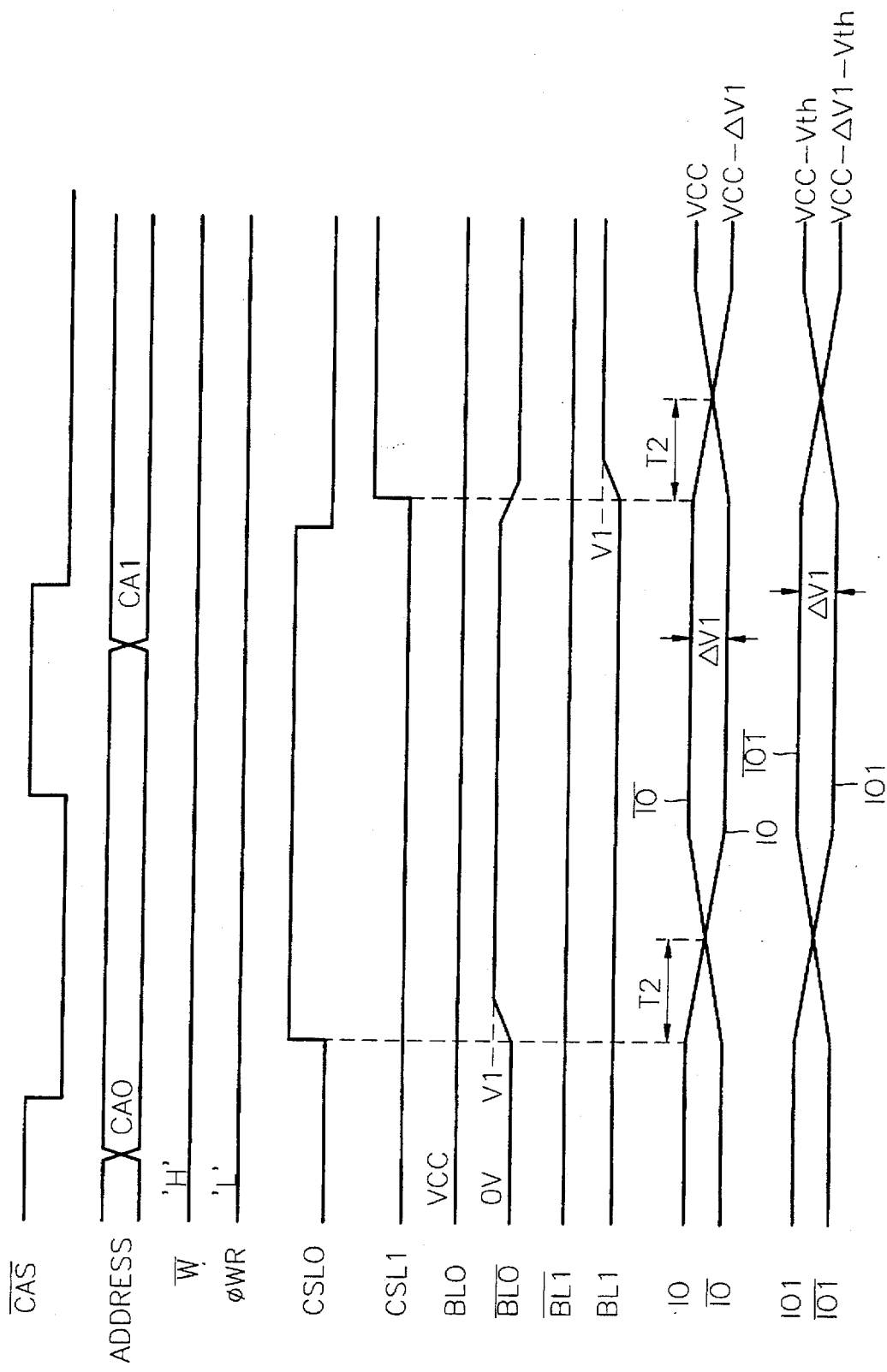
FIG. 2 is an operational timing diagram according to the circuit illustrated in FIG. 1.

FIG. 2 is a timing diagram for a read operation with the circuit illustrated in FIG. 1. During a first page mode, column addresses CA0 and CA1 are input according to the cycling of a column address strobe signal CAS~ and when a write enable signal W~ is high. A column select line CSL0 is enabled by the column address CA0. The bit line BL0in a high state maintains the voltage level VCC. During a low state, the voltage level of the bit line BL0~ is equal to V1, not VSS. The voltage V1 is due to the DC current path along MP4, MN4, MN2 and VSS formed when the load transistor MP4 is activated as described above.

When the column select line CSL0 toggles high, the voltage levels of the input and output lines IO and IO~ are toggled by the P-type sense amplifier 12 and the N-type sense amplifier 14. The sense amplifiers are connected between the bit lines BL0 and BL0~ and toggle the bit lines after a time T2. The voltage levels of the input and output lines IO and IO~ are decreased by the amount of the threshold voltage $V_{tn}$ in the NMOS transistors MN5 and MN6 in a level shifter 40. The transistors MN5 and MN6 are coupled to the input and output lines IO1 and IO1~. The decreased voltage of the input and output lines IO1 and IO1~ is amplified by an input and output (IO) sense amplifier 60 and then output to data lines DO and DO~. The voltage levels of the input and output lines IO and IO~ and are decreased before feeding into the IO sense amplifier 60 in order to operate input transistors in a saturation region, when the IO sense amplifier 60 comprises a differential amplifier.

According to the conventional voltage control circuit shown in FIG. 1, DC current is continuously consumed from the load transistors MP3 and MP4 during the entire period that the first column select line CSL0 is enabled. When the voltage levels of the input and output lines are toggled by the bit line sense amplifiers 12 and 14, the load transistors MP3 and MP4 remain active. As a result, the voltage levels of the input and output lines are prevented from transitioning from the high level of VCC to the low level of VCC–ΔV1. Thus, the toggle speed of the input and output lines is decreased. Here, ΔV1 represents the voltage difference between the input and output lines IO and IO~.

According to the present invention, a new voltage control circuit is used in conjunction with the input and output lines in the semiconductor device to reduce current consumption and to accelerate the toggle speed of the input and output lines.

Figure 3:
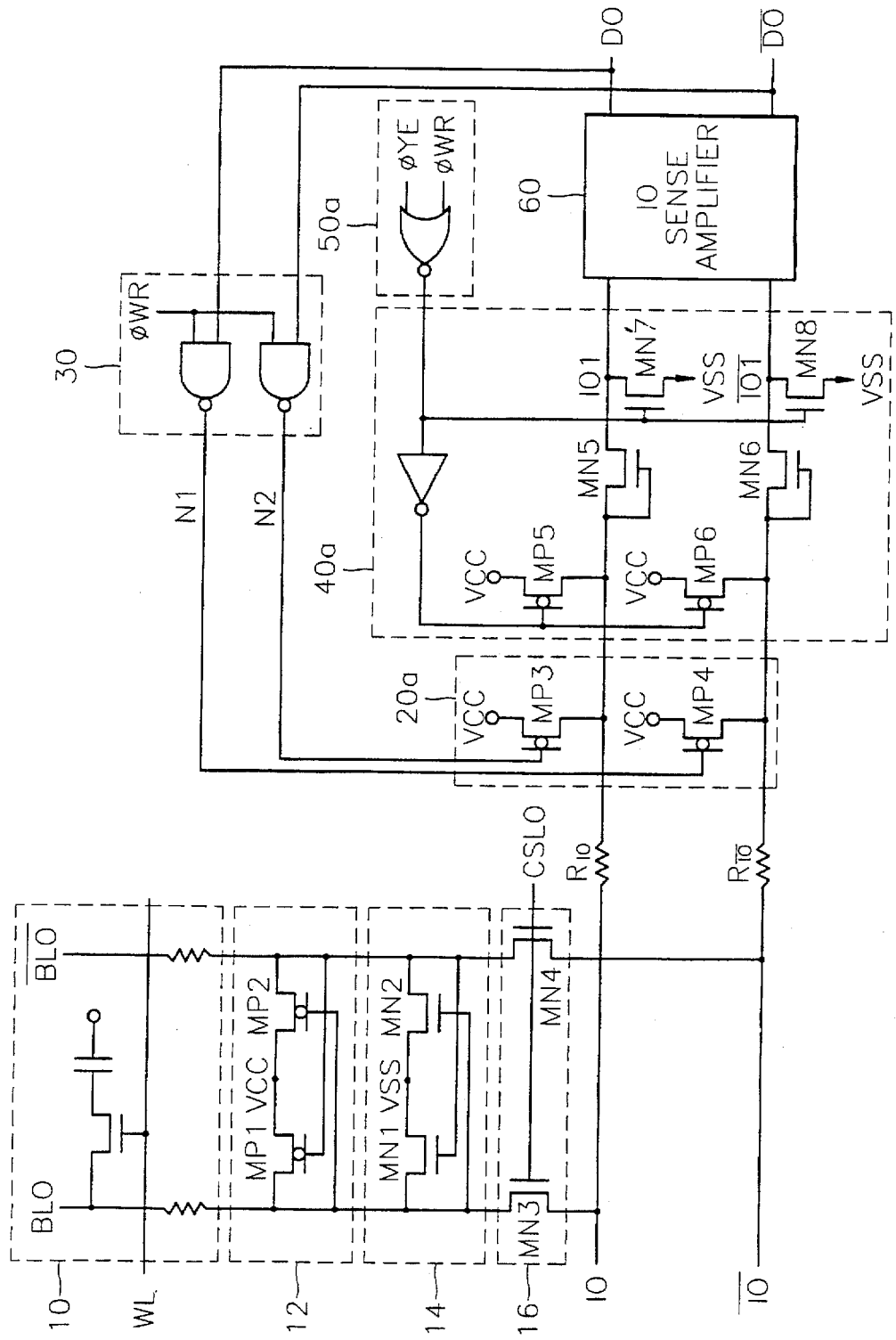
FIG. 3 is a diagram illustrating a voltage control circuit coupled to input and output lines according to a preferred embodiment of the present invention.
Figure 4:
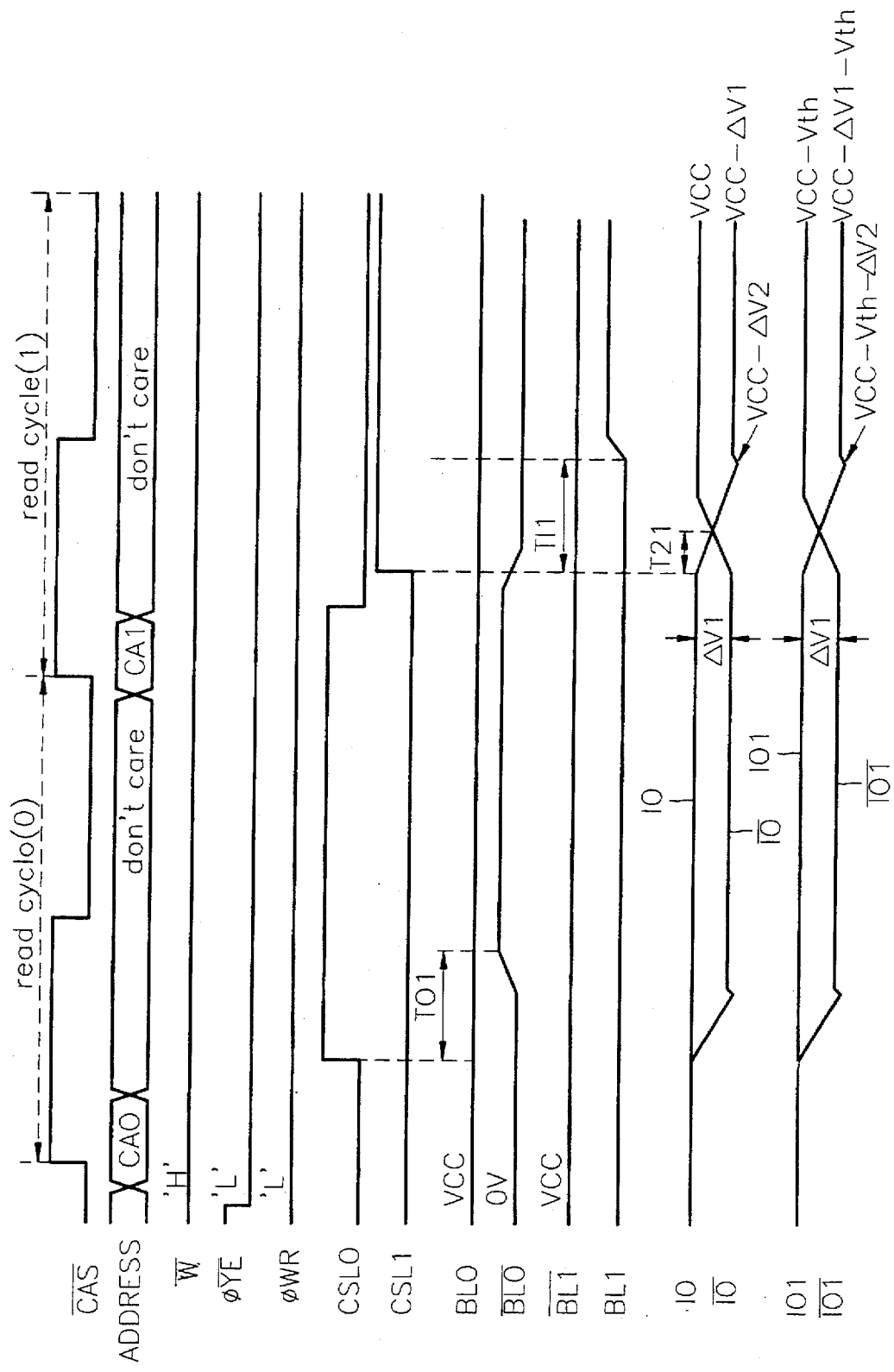
FIG. 4 is an operational timing diagram according to the circuit illustrated in FIG. 3.

Referring to FIGS. 3 and 4, a preferred embodiment of the present invention will be described. The circuits and devices which perform the same operation as those shown in FIGS. 1 and 2 have the same reference numerals as those shown in FIGS. 1 and 2.

FIG. 3 is a diagram illustrating a voltage control circuit for the input and output lines according one embodiment of the present invention. FIG. 4 is a timing diagram according to the circuit illustrated in FIG. 3.

Referring to FIG. 3, in the load transistor control circuit 30, φWR signal is high during a read operation and low during a write operation. The output DO of the IO sense amplifier 60 serves as another input of the load transistor circuit 30. When φWR is high and D0~ is high, a node N2 becomes low. That is, when the data D0 is low, only the load transistor MP3 of clamp circuit 20a is activated. Thus, the voltage on the input and output lines is clamped, not lowered. When the data in the memory cell, selected by the next column address CA1 is high, the voltage of input and output lines IO and Io~ should be toggled.

The voltage of the input and output line IO rapidly increases from the low level of VCC-ΔV1 to the high level of VCC since the load transistor MP3 of the clamp circuit 20a is activated. Also, the voltage of the complementary input and output line IO~ rapidly decreases from the high level of VCC to the low level of VCC–$V_{tn}$–ΔV2 since the load transistor MP4 of the clamp device 20a is deactivated. As a result, the time from the activation of the next column select line CSL1 to the time when the voltage of input and output lines IO and IO~ toggles, is decreased to T21. The time T21 is less than the time T2 in the conventional voltage control circuit in FIG. 1, thereby speeding up memory access time. The high speed effect shown in FIG. 3 is further increased of prior art circuitry in memory chips having long input and output lines above 256 megabits.

When the data on the bit lines corresponding to the next column select line to be selected is transferred to the input and output lines IO and IO~, the DC current path disappears during time T01 and T11 shown in FIG. 4. That is, during the time period when the data on the input and output lines IO and 1IO~I0 is toggled, the direct current path is removed decreasing current consumption.

In the operation of a level shifter 40a and a level shifter control circuit 50, PMOS transistors MP5 and MP6 of the level shifter 40a are small in size. The transistors MP5 and MP6 prevent the input and output lines IO and IO~ from floating and always provide small direct current from MP5 to MN7, and from MP6 to MN8, respectively. Accordingly, the voltage of the input and output lines IO1 and IO1~ is less than the voltage of the input and output lines IO and IO~ by as much as the threshold voltage of NMOS transistors MN5 and MN6.

The level shifter control circuit 50 functions to deactivate the transistors MP5, MP6, MN7 and MN8 during a stand-by condition (φYE=high) and a writing operation (φWR=high). Here, the level shifter 40a is required for the IO sense amplifier 60 to easily sense a voltage difference of the input and output lines IO1 and IO1~. Like the above-described conventional circuit, when the IO sense amplifier 60 comprises a differential amplifier type, transistors of the IO sense amplifier 60 connected to the input and output lines IO1 and IO1~ are operated in the saturation region, so that a small voltage difference can be easily sensed.

In the conventional voltage control circuit, the load transistors MP3 and MP4 are always activated during the read operation. In the voltage control circuit according to the invention, activation of the load transistors depends on the output of the IO sense amplifier 60. Thus, only the load transistor MP4 is activated during a high state and only the load transistor MP3 is activate during a low state. Accordingly, the direct current path is eliminated when the voltage levels of the input and output lines IO and IO~ are toggled, increasing operation speed and reducing current consumption.

As described above, according to the voltage control method for the input and output lines of the present invention, the access time can be reduced in a synchronous memory device which should continuously access data during a short time cycle without precharge of the input and output lines, thereby performing a high frequency operation and preventing the increase of power consumption in the short time cycle.

What is claimed is:

1. A voltage control circuit for a semiconductor memory device having:

a pair of bit lines coupled to a plurality of memory cells for storing data;

a pair of input and output lines coupled to the bit lines;

a pair of data lines coupled to the input and output lines and outputting output data according to the stored memory data; and a clamping circuit coupled between the input and output lines and the data lines comprising a pair of load transistors maintaining complementary conductive states that toggle back and forth according to the output data on the data lines, the clamping circuit selectively clamping the input and output lines to predetermined voltage levels according to the output data on the data lines.

2. A voltage control circuit according to claim 1 wherein the clamping circuit includes a pair of NAND gates each coupled at an output to one of the load transistors and coupled at an input to complementary output data on the data lines.

3. A voltage control circuit according to claim 2 including an IO sense amplifier coupled between the input and output lines and the data lines.

4. A voltage control circuit according to claim 3 including a level shifter coupled between the input and output lines and the IO sense amplifier, the level shifter including the following:

level shifter transistors coupled to the input and output lines for providing a DC current; and a level shifter control circuit coupled to the level shifter transistors for selectively activating the level shifter transistors only during read operations.

5. A voltage control circuit according to claim 4 wherein the level shifter transistors comprise a pair of NMOS transistors coupled between a power supply voltage and the input and ouput lines and a pair of PMOS transistors coupled between the input and output lines and the ground potential.

6. A voltage circuit according to claim 4 wherein the level shifter control circuit comprises a gate having an input coupled to a read and write line and an output coupled to gates on the level shifter transistors.

7. A voltage control circuit for a semiconductor memory device having:

a pair of bit lines coupled to a plurality of memory cells;

a bit line sense amplifier coupled between the bit lines for sensing and amplifying a voltage difference between the bit lines;

a pair of input and output lines coupled to the bit lines through a column select gate;

an input and output line sense amplifier coupled to the input and output lines for sensing and amplifying the voltage difference of said input and output lines;

a pair of data lines coupled to the input and output line sense amplifier for generating an output;

a clamping circuit coupled between the input and output lines and the data lines, the clamping circuit clamping low states on the input and output lines to a predetermined voltage according to the output on the data lines; and a control circuit coupled between the data lines and the clamping circuit, the control circuit disabling the clamping circuit during data transitions on the input and output lines.

8. A voltage control circuit for a semiconductor memory device having:

a pair of bit lines coupled to a plurality of memory cells;

a bit line sense amplifier coupled between the bit lines for sensing and amplifying a voltage difference between the bit lines;

a pair of input and output lines coupled to the bit lines through a column select gate;

an input and output line sense amplifier coupled to the input and output lines for sensing and amplifying the voltage difference of said input and output lines;

a pair of data lines coupled to the input and output line sense amplifier for generating an output; and a clamping circuit coupled between the input and output lines and the data lines, the clamping circuit clamping low states on the input and output lines to a predetermined voltage according to the output on the data lines, the clamping circuit comprising a pair of load transistors maintaining complementary activation states and toggling between activation states according to the output on the data lines.

9. A method for controlling voltage levels in a semiconductor memory device, comprising:

storing data in memory cells;

transferring the data to input and output lines;

conditioning the data on the input and output lines;

outputting the conditioned data; and selectively clamping the input and output lines to predetermined voltage levels according to the conditioned output data by maintaining complementary clamping states on the input and output lines and toggling the clamping states back and fourth on the input and output lines according to the conditioned output data.

10. A method for controlling voltage levels in a semiconductor memory device, comprising:

storing data in memory cells;

transferring the data to input and output lines;

conditioning the data on the input and output lines;

outputting the conditioned data;

selectively clamping the input and output lines to predetermined voltage levels according to the conditioned output data; and enabling clamping the input and output lines when data is read from the memory device and disabling the clamping the input and output lines when data is written to the memory device.

11. A method according to claim 10 including disabling the step of clamping when the input and output lines are transitioning between high and low logic states.

* * * * *